United States Patent [19]

Nishizawa et al.

[11] Patent Number: 4,571,727

[45] Date of Patent: Feb. 18, 1986

[54] FAR-INFRARED ELECTROMAGNETIC WAVE GENERATOR

[75] Inventors: Jun-ichi Nishizawa; Ken Suto, both of Sendai, Japan

[73] Assignee: Zaidan Hojin Handotai Kenkyu Shinkokai, Sendai, Japan

[21] Appl. No.: 521,226

[22] Filed: Aug. 9, 1983

Related U.S. Application Data

[63] Continuation of Ser. No. 229,853, Jan. 30, 1981.

[30] Foreign Application Priority Data

| Mar. 27, 1980 [JP] | Japan | 55-39715 |
| Mar. 27, 1980 [JP] | Japan | 55-39716 |
| Mar. 27, 1980 [JP] | Japan | 55-39717 |

[51] Int. Cl.⁴ .............................................. H01S 3/30
[52] U.S. Cl. .......................................... 372/4; 372/44
[58] Field of Search ..................... 372/4, 43, 44, 39; 357/16, 17, 61

[56] References Cited

U.S. PATENT DOCUMENTS 3,611,180  10/1971  Lasser ...................................... 372/4
4,286,231  8/1981   Makita ..................................... 372/43

OTHER PUBLICATIONS

Nakamura et al., "Photoconductivity Associated with Auger Recombination of Excitons Bound to Neutral Donors in Te-Doped Gallium Phosphide"; Jou. of Physical Soc. of Japan, vol. 34, No. 3, Mar. 1973.
Edmonds et al., "Spectral Tuning and Mode Control in GaAs Injection Lasers"; IBM Tech. Disc. Bull., vol. 12, No. 11, Apr. 1970.

*Primary Examiner*—William L. Sikes
*Assistant Examiner*—Léon Scott, Jr.
*Attorney, Agent, or Firm*—Cushman, Darby & Cushman

[57] ABSTRACT

A far-infrared electromagnetic wave generator comprises a semiconductor containing at least one impurity which has an energy difference, close to a quantum energy of optical phonon, between its transition levels; a resonator having two reflectors for effecting positive feedback of an electromagnetic wave corresponding to the quantum energy; and means for applying an electric current across the semiconductor. The semiconductor may have p-i, n-i, p-i-n, p-n, or n-p⁻ junction. One of the reflectors of the resonator may have a diffraction grating so that the wavelength of the electromagnetic wave to be generated can be varied by adjusting an angle of the diffraction grating.

14 Claims, 8 Drawing Figures

FAR-INFRARED ELECTROMAGNETIC WAVE GENERATOR

This is a continuation of application Ser. No. 229,853, filed Jan. 30, 1981.

BACKGROUND OF THE INVENTION (a) Field of the Invention

The present invention relates to a semiconductor for generating an electromagnetic wave, and more particularly, to a far-infrared electromagnetic wave generating semiconductor using phonons.

(b) Description of the Prior Art

It is known that each atom in a semiconductor tends to oscillate about an equilibrium position due to the interplay of thermal energy and the forces which bind together the atoms in the semiconductor crystal. The thermal energy of the semiconductor is considered to be contained in certain combinations of partical vibrations called normal modes. Each normal mode contains a discrete quanta of energy, $E=h$ of $\omega$ where $\omega$ is the frequency of the mode and h is planks constant divided by $2\pi$. These quanta of energy are referred to as "phonons".

There are two types of phonons, acoustical phonons and optical phonons. Acoustical phonons represent motion of atoms, similar to vibrations obtained when a sound wave is propagated through the crystal. Optical phonons represent motion in which the center of mass of the different atoms in a molecule remains fixed, but the atoms in the molecule move relative to each other. Phonons also exhibit two different modes, longitudinal (LO) where the atoms vibrate in the same direction as phonon movement, and transverse (TO) where the atoms vibrate perpendicular to the phonon motion.

The present inventors have already proposed an electromagnetic wave generator which can generate coherent electromagnetic waves having a wavelength in the range of from the submillimeter region to the far-infrared region (a wavelength from $10\mu$ to 1 mm) using lattice vibration, i.e. phonons, in a semiconductor.

Coherent electromagnetic waves have been generated by exposing a semiconductor to a beam of incident light having a frequency $\omega_o$ to cause excitation of lattice vibration $\omega_r$ in the semiconductor and Raman scattering $\omega_{s,a} = \omega_o \mp \omega_r$. This Raman scattering, in turn, causes lights indicated by $\omega s, a$. Thus, a coherent lattice vibration $\omega_r$ is excited due to the oscillation of the photons to produce a simultaneously coherent electromagnetic wave.

Drift velocity of electrons (or holes) $v_d$ can be increased by applying either a high direct current voltage or a microwave voltage across a semiconductor until it reaches the condition that optical phonons (quantum energy, $h\omega_r$), i.e., $\frac{1}{2}mv_d^2 - \simeq h$, $\omega_r$ are excited. Since $\omega_r$ is substantially constant, the drift velocity of electrons is almost constant, i.e., velocity is saturated. Under such a conditions, many phonons are vigorously produced. However, the wavelength of the phonons produced by the collision between free electrons and lattices is shorter than that of a light wave so that it is not easy to achieve a phase-matching therebetween. Moreover, most of the phonons are longitudinal optical (LO) phonons, where which cannot interact with far-infrared electromagnetic wave. On the other hand, in the case of collisions of free electrons with impurities, the problem of phase-matching does not occur and, therefore, the drawback that the wavelength of the produced phonons being shorter than that of a far-infrared electromagnetic wave can be avoided. In addition, the phonons which are produced are not limited to LO type phonons.

On the othr hand, U.S. Pat. No. 3,611,180 suggests a far-infrared laser in which free electrons and positive holes in a non-polar semiconductor, such as Ge or Si, are accelerated to produce a collision excitation of an impurity. That is, the electrons are excited to the energy levels of the excited states of those in the impurity and, when the electrons of the impurity descend to lower levels, photons of far-infrared light are emitted. However, a quantum transition between the shallow energy levels in a semiconductor generally has an extremely low efficiency of emitting photons, and alternatively will emit phonons, and therefore has a high probability of a radiationless transition. The reason is that the electrons caught in the shallow energy level move in a much larger radius than the lattice distance in the semiconductor due to a weak connection with the impurities. Thus, the collision with crystal lattices freely occurs and a lattice vibration will be generated, that is, the phonons will be excited before the photons are emitted. Accordingly, the far-infrared laser using impact excitation of the impurity has been merely proposed without being realized.

Also, in the generation of far-infrared light, the absorption coefficients of the free electrons and positive holes become large in proportion to $\lambda^2$ in respect of a wavelength $\lambda$. That is, in the far-infrared light having a wavelength of 20 $\mu$m, the free carrier absorption is large, e.g., as much as 400 times greater than with near-infrared light having a wavelength of 1 $\mu$m. Thus, it has been difficult to substantially amplify a far-infrared electromagnetic wave. Further, the energy of the shallow level in Ge and Si is very small and is substantially ionized at room temperature. It, therefore, has never been used to generate far-infrared light.

It is an object of the present invention to provide a far-infrared electromagnetic wave generator without the above drawbacks. That is, a polariton mode wave particular to a polar semiconductor, unlike Ge and Si, is used and, although the energy produced by the transition between impurities is mainly a phonon, the polariton mode is amplified by positively utilizing the phonon to generate the far-infrared electromagnetic wave.

SUMMARY OF THE INVENTION

It is a primary object of the present invention to provide an improved far-infrared electromagnetic wave generator made of a semiconductor having a higher efficiency than that of the conventional one.

Another object of the present invention is to provide a device which is capable of generating electromagnetic waves in the far-infrared region by applying an electric current across a semiconductor and which can avoid a need for the provision of a light source for impinging a light onto the semiconductor.

Still another object of the present invention is to provide a semiconductor structure which is useful for effectively producing phonons.

A further object of the present invention is to provide a resonator structure for use in generating electromagnetic waves of variable wavelengths.

DETAILED DESCRIPTION OF THE PREFERRED EMBODIMENTS

Figure 1:
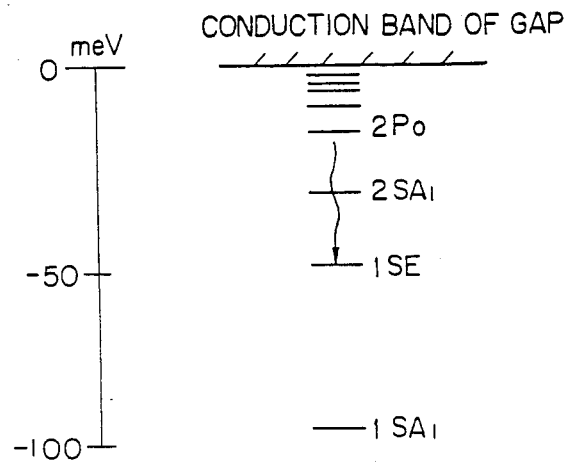
FIG. 1 is an energy level scheme of Gallium Phosphide (GaP) crystal containing Tellurium (Te), a donor impurity, showing a ground state level and excited state levels of the impurity.

FIG. 1 shows the energy level in the ground state as well as the energy levels in the excited state of a donor in a GaP polar semiconductor crystal. Although the following discussion is directed to the instance wherein the impurity is Te, almost the same discussion may apply to instances where the impurity is Se or S. The ground level of Te in the GaP crystal is at a position of about 90 meV as viewed from the bottom of the conduction band. Therefore, most electrons in an n type GaP crystal are in the ground state when this crystal is cooled to a temperature of about 80° K. or lower. Under such a conditions, an intensive electric field is applied across the semiconductor. If free carriers exist in the semiconductor (which may be produced by any method such as by irradiating the semiconductor with light rays or by keeping the temperature thereof at 80° K. or higher, e.g. about 150° K., to produce free carriers, the free carriers) will, upon application of a high electric field, be forced to move at an accelerated speed to collide with the Te impurity. This collision, in turn, excites the electrons of the impurity up to higher energy levels. Thus, the electrons are excited to transition levels or to a conduction band (which are equivalent to the non-binding continuous excited state of the donor impurity), as shown in FIG. 1. Even in the case of such a collision excitation, a selection rule is applied. For example, referring to an energy level scheme as shown in FIG. 1, the electrons are excited to jump very frequently from the ground state $1SA_1$ to a higher level $2P_o$ or a conduction band, but rarely to the level 1SE by the collision excitation. On the other hand, the electrons excited to the energy levels of $2P_o$ or higher descend to the lower energy levels with or without the accompaniment of radiation. Generally, in the case of shallow energy levels of the impurity, the probability of generation of radiation is small, which means that the excited electrons descend to lower levels while producing phonons.

Although the previous discussion has related to donor impurities, acceptors may be used in place of donors and other deeper levels than those mentioned above of any other impurity may be equally effective, provided that energy levels in the excited states are available.

Figure 2:
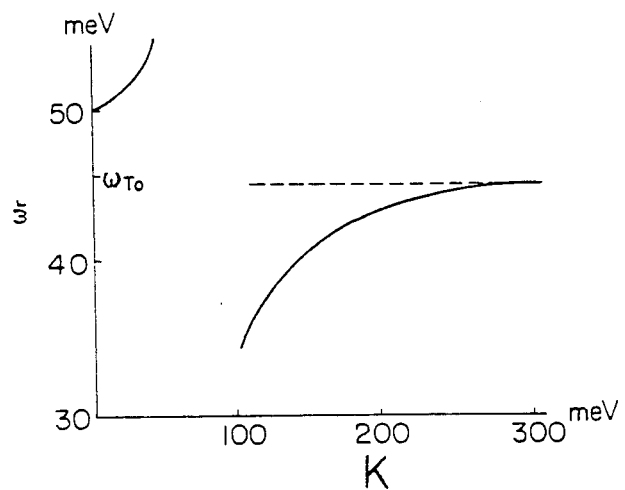
FIG. 2 shows a distribution relationship between frequency $\omega_r$ and the wavenumber k of the phonons of the transverse type produced in the GaP crystal when the wavenumber k is small.

Referring to FIG. 2, there is shown a relationship between wavenumber k and frequency $\omega_r$ of the transverse optical phonon (TO) where the atoms vibrate perpendicular to the phonon motion. When the wavenumber k is small, the far-infrared electromagnetic wave couples with the phonon to form the so-called Polariton mode (present in polar semiconductors in which transverse optical phonons are infrared active), so that the frequency $\omega_r$ will decrease, and at the same time the contribution of the electromagnetic wave to lattice vibration becomes relatively large. While optical phonons are present in silicon and germanium, it is well-known that such a Polariton mode is not formed unless the semiconductor has polar characteristics, i.e., is a "polar semiconductor." A "polar seminconductor" is a semiconductor having a lattice formed with positive and negative ions which give rise to polarization in the presence of an electric field. Group III-V compound semiconductors and Group II-VI compound semiconductors are typical polar semiconductors. See, for example, Kittel, *Quantum Theory of Solids*, Wiley & Sons, 1963 and Willardson et al, *Semiconductors and Semimetals*, Vol. 3, Academic Press, 1967. See also Pankove, *Optical Processes in Semiconductors*, Prentice Hall. If such a a mode having a wavenumber k in the frequency region where the phonon is coupled with the electromagnetic wave is produced, the phonon is emitted and the electromagnetic wave is inevitably generated. Therefore, amplification of the electromagnetic wave can be effected, though at first sigtnt this transition seems to be a radiationless process. In other words, the energy transition of electrons between the impurity energy levels, results in generation of phonons, and amplification of the electromagnetic wave is markedly great as compared to energy transitions due to photons alone.

Figure 3:
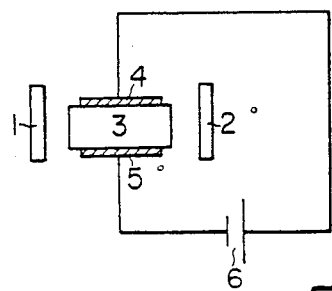
FIG. 3 shows a schematic diagram of a far-infrared electromagnetic wave generator comprising a resonator, a semiconductor crystal and a dc power supply.

A Fabry-Pérot resonator is constructed as shown in FIG. 3. Reflectors $M^1$ and $M^2$ are coated with a reflective material to specifically achieve a high quality factor Q at a desired wavelenth corresponding to the frequency $\omega_r$ in the far-infrared region. In FIG. 3, reference numerals 1 and 2 represent reflectors, 3 a GaP crystal, 4 and 5 electrodes for applying an electric current, and 6 a dc power supply. When a Polariton mode phonon of $\omega_r$ is transmitted through the crystal, the electrons of the impurity, which have been excited to higher energy levels due to collision excitation caused by the application of an electric current, will descend to lower levels corresponding to an energy difference of $\omega_r$. For example, as shown in FIG. 1, an energy difference between 1SE and $2P_o$ or a higher level is about 30 meV and 50 meV. Moreover, the electrons are rarely excited to the 1SE level by the collision ionization. Therefore, transitions from higher energy levels to the 1SE level as indicated by the wave line in FIG. 1 are caused with the generation of phonons. Thus, phonons of Polariton mode in the range of 30 meV to 45 meV are emitted and amplified. Of course, as is apparent from conventional laser theory, a population inversion between the $2P_o$ and ISE levels must be produced. This becomes possible because excitation due to collision takes place selectively for $2P_o$ as discussed previously.

Needless to say, those electrons which have emitted optical phonons and have not assumed the ISE state will further give rise to a relaxation toward the ground state $ISA_1$.

There is another method for exciting or ionizing the electrons of an impurity. Application of an electric current, accelerates thermally excited free electrons in the crystal to bombard the impurity. Similarly, free carriers may be produced by exposure of the crystal to light rays having an energy corresponding approximately to a forbidden band gap, and may be accelerated by an application of an intensive electric field so that the carriers may collide with the impurity.

Figure 4A:
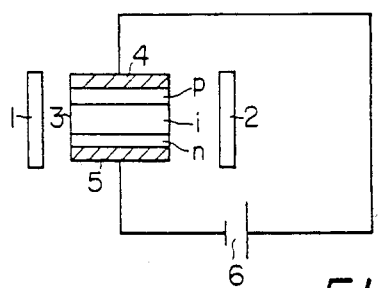
FIG. 4A shows a schematic diagram as shown in FIG. 3, wherein the semiconductor crystal is replaced by a semiconductor having a p-i-n junction.

Alternatively, there is still another method for exciting the electrons of an impurity where an n-i, p-i or p-i-n junction is formed in a semiconductor as shown in FIG. 4A. Numerals 4 and 5 in FIG. 4 represent electrodes as in the instance of FIG. 3, through which an electric current is caused to flow. The region i has a relatively low impurity concentration, and this impurity participates in the generation of electromagnetic waves or laser generation. It is well-known that, when a forward voltage is applied, positive holes are injected into the region i from the p-i junction, and electrons are injected thereinto from the n-i junction. As taught by ordinary diode theory, in such instance the voltages which are applied to the p-i junction and to the n-i junction necessary for the injection are of the order of a diffusion potential, i.e., in case of GaP, 1–2 V. The remainder of the applied voltage is applied to the region i.

Figure 4B:
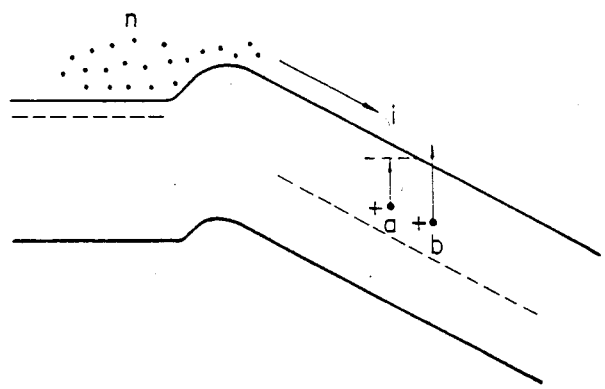
FIG. 4B is an energy level scheme of the semiconductor shown in FIG. 4A upon application of a bias voltage to the device of FIG. 4A.

As discussed earlier herein, if, for example, the region i has a thickness of 10μ, the voltage per se which is necessary for this region will be about 20 V or more. Needless to say, it is also well-known that if the thickness of this region i is too small and is shorter than the diffusion length of carriers, the region i will be filled with the injected carriers and will no longer permit application of a voltage. FIG. 4B shows an energy level scheme where a voltage is applied across the n-i junction in a forward direction. In this case, free electrons injected into the i type layer are accelerated upon application of a high electric field to bombard the Te impurity. Appropriate voltage and semiconductor layer thicknesses can be determined by conventional techniques as noted above, in order to ensure that the bombardment excites those electrons which are in the ground state into their excited states, the energy which the free carriers acquire from the electric field must be substantially equal to or greater than the difference in energy between the excited state and the ground state, e.g., 30 to 50 meV. However, it is well-known that if the electric field is too intense, destruction of insulation will occur due to band-to-band ionization. It is known that, in case of GaP, the electric field is about $3–5 \times 10^5$ V/cm. Accordingly, it is desirable to apply an electric field of such range as mentioned above. As is also well-known, the applied voltage necessary to produce the required electric field is a function of the crystal thickness. Further, with respect to the thickness of the crystal, it is conventional knowledge that the crystal must be sufficiently thick to confine the mode of the far-infrared electromagnetic wave within the thickness. Greater thickness may, of course, be used. However, as noted above, the greater thickness will, of course, require an applied voltage which is correspondingly higher. For example, if the thickness is 100μ, the required applied voltage is 200 V. However, if the thickness if 10μ, the required voltage would be 20 V. This bombardment, in turn, excites the electrons to the energy levels of the excited states as indicated by symbol "a" in FIG. 4B or to the conduction band due to ionization as indicated by symbol "b". The electrons excited to the transition levels descend back to the ground state with emission of phonons. Appropriate voltage and semiconductor layer thicknesses can be determined by conventional techniques as noted above, in order to ensure that the bombardment excites those electrons which are in the ground state into their excited states, the energy which the free carriers acquire from the electric field must be substantially equal to or greater than the difference in energy between the excited state and the ground state, e.g., 30 to 50 meV. However, it is well-known that if the electric field is too intense, destruction of insulation will occur due to band-to-band ionization. It is known that, in case of GaP, the electric field is about $3–5 \times 10^5$ V/cm. Accordingly, it is desirable to apply an electric field of such range as mentioned above. As is also well-known, the applied voltage necessary to produce the required electric field is a function of the crystal thickness. Further, with respect to the thickness of the crystal, it is conventional knowledge that the crystal must be sufficiently thick to confine the mode of the far-infrared electromagnetic wave within the thickness. Greater thicknesses may, of course, be used. However, as noted above, the greater thickness will, of course, require an applied voltage which is correspondingly higher. For example, if the thickness is 100μ, the required applied voltage is 200 V. However, if the thickness is 10μ, the required voltage would be 20 V.

In addition, the electric field must be of a value insufficient to completely ionize the Te impurity. Needless to say, the ionization energy of Te is 90 meV as contrasted to the energy of an optical phonon, which is about one-half thereof, i.e., 45 meV. Thus, an application of an electric field having an intensity necessary for exciting optical phonons would not immediately develop complete ionization of Te.

The i type layer may not be a high resistance region at room temperature. Even if it contains an impurity concentration of about $10^{17}/cm^3$ Te, it can have a sufficiently high resistance at 150° K. to make it possible to apply an electric field. If the impurity in the p type layer is Zn, holes can exist even at 150° K. because of the shallow energy levels of Zn. It is, therefore, possible that holes are injected into the n type layer which becomes an i type layer at lower temperatures, and accelerated to bombard the impurity, resulting in an excitation of the latter. Alternatively, the electric field may be applied in a reverse direction, and free electrons released in the i type layer or those excited by light rays can be used instead of injection from a p-i or n-i junction.

In the above embodiments, the level of the Te impurity is at a position of about 90 meV, so that a considerable proportion thereof is ionized at room temperature, and the efficiency becomes lower. Impurities, having a deeper energy level are preferred for the construction of a far-infrared electromagnetic wave generator which works at room temperature. Since a variety of deep levels, and also a variety of transition levels exist, convenient pairs of energy levels in the excited may be found. For example, oxygen O produces a very deep level of 0.9 eV in GaP. This value represents the ground state. Energy levels in the excited states are almost in the same positions as for those of Te as shown in FIG.

1. Therefore, this value is convenient for the generation of electromagnetic wave at room temperature.

Figure 6A:
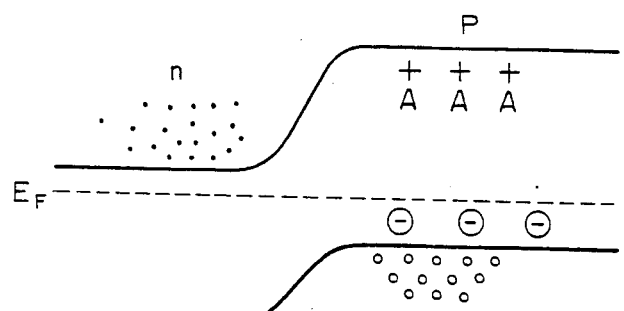
FIG. 6A is an energy level scheme of a semiconductor, in the absence of applied voltage, which has a p-n junction and contains an ionized donor impurity in the p-type region.
Figure 6B:
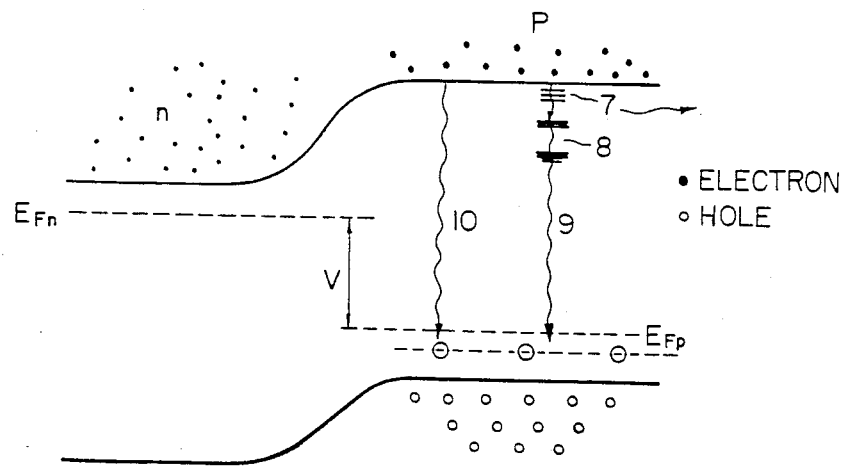
FIG. 6B is an energy level scheme as shown in FIG. 6A, where a voltage is applied across the semiconductor.

The above embodiments illustrate generations in the semiconductor region where electrons exist in the ground state at a sufficient probability of existence at a thermal equilibrium. In contrast thereto, the following embodiment illustrates the use of donor energy level provided by, for example, the Te impurity in a p type semiconductor for effecting far-infrared electromagnetic wave generation. This method is the same as the previous ones in that the phonon of Polariton mode is used for the far-infrared electromagnetic wave generation, but it is different from the previous ones in that a p-n junction is formed as can be seen from the energy level scheme of FIG. 6A. FIG. 6A illustrates the band scheme where no voltage in a forward direction is applied across the p-n junction. In the absence of voltage, the impurity D (e.g. Te) participating in the laser generation according to the present invention is ionized in the p type region so that there is no electron capable of contributing to transitions. When a voltage V is applied across the p-n junction in a forward direction as shown in FIG. 6B, electrons are injected into the p type region at the p-n junction and are trapped by the impurity D. In such case, the device has a resonator as shown in FIG. 3, and free electrons will descend directly from the conduction band or from the energy levels of the excited state which are quite close to the conduction band to, for example, the 1SE level as indicated by the reference numeral 7 in FIG. 6B, while emitting phonons of the Polariton mode. Then, the electrons descend to the ground state as indicated at 8, and then recombinations of the electrons with holes occur due to the transition as indicated at 9, resulting in visible luminescence. In this case, the p type region of the semiconductor is not under application of any intensive electric field. As the recombination of free electrons with holes, there is another type of recombination as indicated by 10, besides the aforementioned one, which does not contribute to the far-infrared electromagnetic wave generation and, therefore, the efficiency is reduced. For this reason, the concentration of acceptor in the p type region should be minimized. Preferably, instead of the p type region, there is employed an n-p$^-$ junction where the p$^-$ type region has a large compensation of donor and acceptor. In the case of FIG. 6 also, a Polariton mode is generated by the transition between the excitation levels of the impurity. Therefore, as in the case of the preceding instance, a population inversion between these levels is needed.

Figure 5:
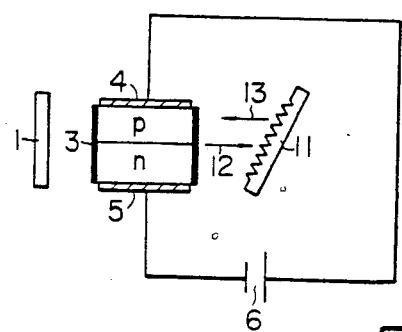
FIG. 5 shows a schematic diagram of a far-infrared electromagnetic wave generator in which one of the reflectors of the resonator has a diffraction grating so that the wavelength of the generated electromagnetic wave can be varied.

The frequency of optical phonons (TO phonons) in the semiconductor varies with the material of the semiconductor. In case of group III-V semiconductors, the frequency thereof corresponds to a wavelength of about 20$\mu$ to 100$\mu$. Therefore, this method can produce an electromagnetic wave generator in a wide range of far-infrared wavelengths (such as a wavelength from 10$\mu$ to 300$\mu$) by selecting various materials other than GaP. Since TO phonons are distributed in such a separate distribution relationship as shown in FIG. 2, the frequency of the far-infrared wave may be altered continuously to the lower frequency side than that of the TO phonons. To this end, one of the reflectors of the resonator may be replaced by a far-infrared diffraction grating 11 as shown in FIG. 5, and the angle thereof may be adjusted to vary the wavelength of the electromagnetic wave to be generated. In this case, the light of a desired wavelength can be selectively subjected to a retrodirective reflection to effect feedback as indicated at reference numerals 12 and 13 in FIG. 5.

What is claimed is:

1. A far-infrared electromagnetic wave generator comprising:

a polar semiconductor producing a Polariton mode which forms a coupled mode having far-infrared radiation and an optical phonon when the relative vibration of positive and negative ions generates a transverse wave having a coherent lattice vibration frequency $w_r$ and a wave number k, said polar semiconductor containing at least one impurity, said impurity having an excited electron state and a lower electron state, the difference is quantum energy between the excited state and the lower state of said impurity substantially corresponding to a value on a dispersion curve of optical phonons in said semiconductor;

a resonator for effecting positive feedback of an electromagnetic wave corresponding to said difference in quantum energy; and means for applying an electric current across said semiconductor for accelerating carriers or injecting carriers to excite electrons of said impurity into said excited state, thereby inducing phonon emission transitions toward said lower electron state under a population inversion condition of said impurity, said transition amplifying said Polariton mode wave.

2. A generator according to claim 1, in which said semiconductor is a GaP crystal, and said impurity is a donor impurity.

3. A generator according to claim 2, in which said impurity is selected from a group consisting of Te, Se and S.

4. A generator according to claim 1, in which said impurity is an acceptor impurity.

5. The far-infrared electromagnetic wave generator of claim 1 wherein:

said semiconductor includes an i type layer of a relatively high resistivity and including said impurity, and a semiconductor layer of a first conductivity type forming a junction with said type layer; said junction comprising means for injecting carriers into said i layer from said junction, and for accelerating said carriers to cause a collision-excitement of said impurity, and develop said energy transitions in said i layer.

6. The generator of claim 5 wherein said first conductivity type layer is p-type.

7. The generator of claim 5 wherein said first conductivity type layer is n-type.

8. The generator of claim 5 wherein said semiconductor further comprises a second conductivity type layer, disposed with said first conductivity type and i type layers to form a p-i-n junction.

9. The generator of claim 5 wherein said resonator includes respective reflectors disposed on either side of said semiconductor.

10. A generator according to claim 9, in which one of the reflectors of said resonator has a diffraction grating.

11. The far-infrared electromagnetic wave generator of claim 1 wherein:

said impurity is disposed in a first region of said semiconductor having a conductivity type opposite to that of said impurity and said semiconductor includes a second region of a conductivity type opposite said first region and forming a p-n junction with said first region, said p-n junction comprising means for injecting minority carriers into said first region through said p-n junction such that said carriers make said energy transition from said excited state of said impurity to said lower impurity electron state.

12. The generator of claim 11 wherein said junction is a n-p⁻ junction.

13. The generator of claim 11 wherein said resonator includes respective reflectors disposed on either side of said semiconductor.

14. A generator according to claim 13, in which one of the reflectors of said resonator has a diffraction grating.

* * * * *